(12) United States Patent
Marcoux

(10) Patent No.: US 8,053,898 B2
(45) Date of Patent: Nov. 8, 2011

(54) CONNECTION FOR OFF-CHIP ELECTROSTATIC DISCHARGE PROTECTION

(75) Inventor: Phil P. Marcoux, Mountain View, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 12/573,724

(22) Filed: Oct. 5, 2009
(Under 37 CFR 1.47)

(65) Prior Publication Data
US 2011/0079912 A1 Apr. 7, 2011

(51) Int. Cl.
*H01L 29/40* (2006.01)

(52) U.S. Cl. . 257/773; 257/672; 257/173; 257/E21.499; 257/E23.141; 438/14; 438/110; 438/10; 438/11; 438/12

(58) Field of Classification Search .............. 438/10–14, 438/110, 109; 257/773, 723, 672, 173, 778, 257/758, 665, 621, E21.499, E23.174, E23.141; 361/56, 111
See application file for complete search history.

(56) References Cited

U.S. PATENT DOCUMENTS

| | | | | |
|---|---|---|---|---|
| 4,818,728 A * | 4/1989 | Rai et al. | | 438/108 |
| 5,075,253 A * | 12/1991 | Sliwa, Jr. | | 438/109 |
| 5,324,687 A * | 6/1994 | Wojnarowski | | 438/107 |
| 5,466,634 A * | 11/1995 | Beilstein et al. | | 438/15 |
| 5,466,892 A * | 11/1995 | Howard et al. | | 174/261 |
| 5,644,167 A * | 7/1997 | Weiler et al. | | 257/777 |
| 5,699,234 A * | 12/1997 | Saia et al. | | 361/790 |
| 5,891,761 A * | 4/1999 | Vindasius et al. | | 438/109 |
| 5,959,357 A * | 9/1999 | Korman | | 257/758 |
| 6,198,136 B1 * | 3/2001 | Voldman et al. | | 257/357 |
| 6,406,948 B1 * | 6/2002 | Jun et al. | | 438/152 |
| 6,469,325 B1 * | 10/2002 | Ishizuka et al. | | 257/173 |
| 6,479,321 B2 * | 11/2002 | Wang et al. | | 438/109 |
| 6,815,821 B2 * | 11/2004 | Yu | | 257/758 |
| 6,831,367 B2 * | 12/2004 | Sekine | | 257/774 |
| 6,847,096 B2 * | 1/2005 | Yanai et al. | | 257/620 |
| 6,933,610 B2 * | 8/2005 | Segaram et al. | | 257/778 |
| 7,394,132 B2 * | 7/2008 | Liu et al. | | 257/355 |
| 7,473,999 B2 * | 1/2009 | Lin et al. | | 257/738 |
| 7,476,563 B2 * | 1/2009 | Mangrum et al. | | 438/106 |
| 7,535,105 B2 * | 5/2009 | Voldman | | 257/758 |
| 7,612,630 B2 * | 11/2009 | Miller | | 333/24 R |
| 7,741,152 B2 * | 6/2010 | Huang et al. | | 438/109 |
| 7,741,949 B2 * | 6/2010 | Inoue et al. | | 338/21 |
| 7,768,762 B2 * | 8/2010 | Ding et al. | | 361/112 |
| 7,847,379 B2 * | 12/2010 | Chung | | 257/678 |
| 7,894,172 B2 * | 2/2011 | Pan et al. | | 361/56 |
| 2001/0010964 A1 * | 8/2001 | Geissler et al. | | 438/381 |
| 2002/0106893 A1 * | 8/2002 | Furukawa et al. | | 438/652 |
| 2005/0023692 A1 * | 2/2005 | Matsunaga et al. | | 257/758 |

(Continued)

*Primary Examiner* — Fernando L Toledo
*Assistant Examiner* — Ankush Singal
(74) *Attorney, Agent, or Firm* — Myers Bigel Sibley & Sajovec, P.A.

(57) ABSTRACT

A method and apparatus for off-chip ESD protection, the apparatus includes an unprotected IC 22 stacked on an ESD protection chip 24 and employing combinations of edge wrap 32 and through-silicon via connectors 44 for electrical connection from an external connection lead 34 on a chip carrier 84 or system substrate 64, to an ESD protection circuit, and to an I/O trace 46 of the unprotected IC 22. In one embodiment the invention provides an ESD-protected stack 50 of unprotected IC chips 52, 54 that has reduced hazard of mechanical and ESD-damage in subsequent handling for assembly and packaging. The method includes a manufacturing method 170 for mass producing embedded edge wrap connectors 32, 38 during the chip manufacturing process.

13 Claims, 9 Drawing Sheets

U.S. PATENT DOCUMENTS

| | | |
|---|---|---|
| 2005/0195549 A1* | 9/2005 | Inoue et al. .................... 361/118 |
| 2005/0230847 A1* | 10/2005 | Lee et al. ....................... 257/782 |
| 2006/0001174 A1* | 1/2006 | Matsui .......................... 257/774 |
| 2006/0065426 A1* | 3/2006 | Anderson .................... 174/71 R |
| 2006/0152334 A1* | 7/2006 | Maercklein et al. ........... 338/210 |
| 2006/0227473 A1* | 10/2006 | Inoue et al. ..................... 361/56 |
| 2007/0029646 A1* | 2/2007 | Voldman ....................... 257/662 |
| 2007/0105304 A1* | 5/2007 | Kasai et al. ................... 438/254 |
| 2007/0181991 A1* | 8/2007 | Ishino et al. .................. 257/686 |
| 2007/0187830 A1* | 8/2007 | Matsunaga et al. ........... 257/758 |
| 2008/0254572 A1* | 10/2008 | Leedy ........................... 438/109 |
| 2008/0296708 A1* | 12/2008 | Wodnicki et al. ............. 257/414 |
| 2009/0195948 A1* | 8/2009 | Kalvesten et al. .............. 361/56 |
| 2009/0283898 A1* | 11/2009 | Janzen et al. ................. 257/698 |
| 2009/0294914 A1* | 12/2009 | Pagaila et al. ................. 257/621 |
| 2010/0059869 A1* | 3/2010 | Kaskoun et al. ............... 257/665 |
| 2010/0237386 A1* | 9/2010 | Lin et al. ....................... 257/173 |
| 2011/0031598 A1* | 2/2011 | Lee et al. ....................... 257/686 |

* cited by examiner

CONNECTION FOR OFF-CHIP ELECTROSTATIC DISCHARGE PROTECTION

BACKGROUND OF THE INVENTION

1. Field of the Invention

The present invention relates generally to the field of semiconductor device manufacturing, and more particularly to electro static discharge (ESD) protection. With still greater particularity the present invention relates to an improved interconnection structures and methods for connecting a separate electro static discharge (ESD) protection circuit to another circuit not on the same die.

2. Description of the Background Art

Protection of a semiconductor integrated circuit (IC) from harmful effects of ESD is conventionally provided in form of special ESD protection circuits and devices located near input/output (I/O) pads on an IC chip, sometimes also referred to as a die. Off-chip ESD protection methods wherein the protection circuit or device is in the same package but not on the same IC chip, are also known in the art. Off-chip techniques are attractive as they reserve the valuable layout area of a high-performance IC chip for its primary circuit function. One such technique, illustrated in FIG. 1A and described by Segaram, Fjelstad, et al. (U.S. Pat. No. 6,933,610), uses wire bonds 10 to connect an external connection lead 11 on a chip carrier or substrate 12 first to an ESD protection device 13, which is mounted on an intermediate substrate 14, and then to an I/O contact 16 of an IC chip 17 that has no on-chip ESD protection. In a variation of the technique, the ESD protection device 13 and substrate 14 of FIG. 1A are replaced as shown in FIG. 1B by an ESD protection chip 15 that includes an ESD protection circuit. While this and other known techniques may be effective under some conditions, they have certain shortcomings that can limit IC performance, especially as technology advances to smaller feature size and faster operating speed. An ideal ESD protection circuit should act as a lightning arrester that is invisible in normal operation but shorts a high voltage surge to ground, bypassing all circuit elements and devices on the IC. A wire bond in series with an I/O connection to a chip, as shown in FIGS. 1A and 1B, has inductance that will not be invisible at high frequency, and thus will be a serious limitation with increasing operating speed of digital and analog ICs. A wire bond connected in parallel with a lower inductance I/O connection of the chip to an external lead, may be invisible at high operating speed, but the series inductance of the wire bond in this case prevents the off-chip ESD protection circuit from acting quickly as a good short circuit, and thus the initial magnitude of an ESD stress voltage on the I/O contact of the IC chip may be excessive, especially for smaller semiconductor feature size and operating voltage on the chip.

An off-chip ESD protection circuit connected with lower inductance and lower impedance, is therefore desirable, especially to keep pace with improvements in IC technology.

SUMMARY OF INVENTION

Accordingly, it is an object of the present invention to provide an improved electrical connection structure and method for off-chip ESD protection for an IC chip that has lower inductance and lower impedance than the current wire bonded method, thereby enabling faster I/O operating speed for the IC chip.

Another object of the invention is to provide an electrical connection structure for off-chip ESD protection, wherein the cross-sectional area of an I/O connector of an IC chip can be tailored according to circuit speed requirement, thus using less active area of the chip.

Yet another object of the invention is to provide a robust ESD protected stack of IC chips with off-chip ESD protection and reduced hazard of ESD damage in subsequent handling, assembly, and packaging for system application.

Still another object of the invention is to provide a robust ESD-protected stack of IC chips with off-chip ESD protection and reduced hazard of ESD damage in subsequent handling, assembly, and packaging for system application, that can be wire bonded to a substrate.

Briefly, the present invention is an improved connection structure and method for off-chip ESD protection, by stacking an unprotected IC chip on an ESD protection chip and employing edge wrap and through-silicon via (TSV) connectors for electrical connection from an external connection lead on a chip carrier or system substrate, to an ESD protection circuit, and to an I/O trace of the unprotected IC. In one embodiment the invention provides a robust ESD-protected stack of unprotected IC chips that has reduced hazard of mechanical and ESD-damage in subsequent handling for assembly and packaging.

DETAILED DESCRIPTION OF THE FIGURES

Figure 1A:
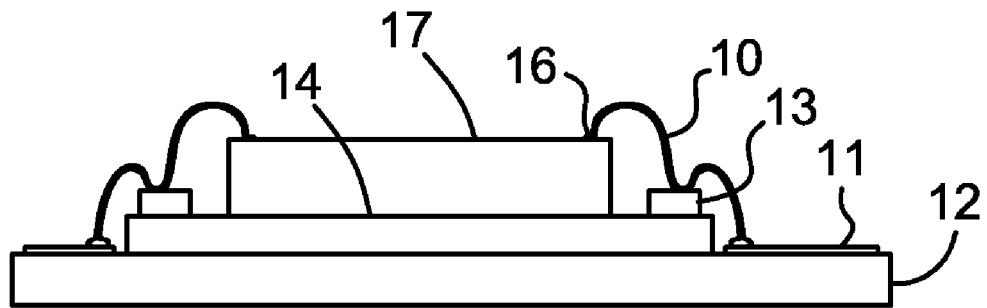
FIG. 1A is front elevation view of a prior art ESD protection device.
Figure 1B:
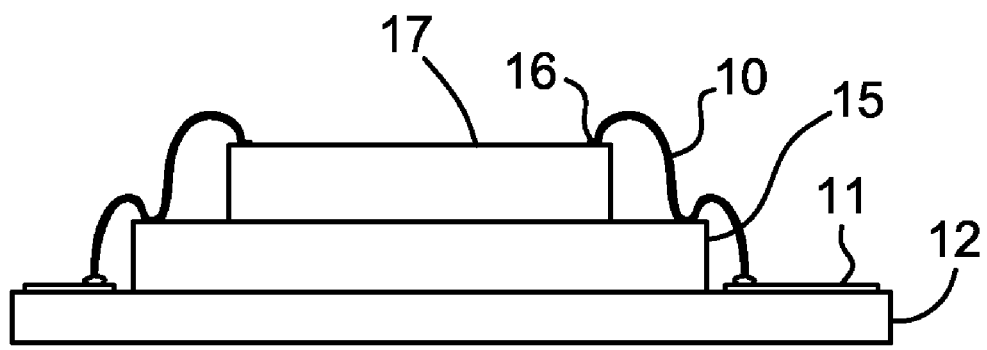
FIG. 1B is front elevation view of a second prior art ESD protection device.

The first embodiment of an apparatus for carrying out the invention is an electronic device including an IC chip without on-chip ESD protection, and a chip holding ESD protection circuitry, stacked on each other, and on a substrate, having edge wrap and through silicon via (TSV) connectors for electrical connection for ESD protection and external I/O. The device, including a stack of chips and a substrate, is depicted symbolically in fragmentary perspective view in FIG. 2 and is designated therein by the reference character 20. In an embodiment of the invention, device 20 includes a stack of chips including an IC chip 22 that has no on-chip ESD protection (herein referred to as an "unprotected" IC chip) and an ESD protection chip 24, and a substrate 26 having electrical connection pads to leads 28, 40 for I/O connection to an external system. Device 20 is further depicted in cross-sectional view in FIG. 3, taken along line A-A identified in FIG. 2. The substrate 26 according to the present invention can be one of a plurality of mechanical attachment and electrical connection means of a stack of chips to an external system, including for example, a chip carrier, circuit board, and ceramic hybrid module, with or without additional components and chips on it. A utility of a chip carrier can be, for example, to adapt (redistribute) a finer I/O contact pitch of an unprotected IC chip to a differently arranged and larger I/O contact pitch preferable for assembly on a system circuit board. Alternatively, a stack of chips can be directly attached to a system circuit board, according to the application.

Chips 22, 24 and substrate 26 are suitably aligned and stacked on and mechanically attached to each other. For mechanical attachment and electrical connection to another chip in a stack of chips, a chip is mounted (attached) horizontally (that is, flat) on another chip with its largest dimension parallel to the surface of the other chip. Likewise for mechanical attachment and electrical connection to the system in which it is used, a chip or stack of chips can be mounted flat on a circuit board or other substrate, with its largest dimension parallel to the surface of the board. It should be noted that the figures are not to scale, and the chips are depicted, for purposes of clarity, larger in their smallest dimension (that is, thicker) than may be preferred in actual embodiment.

A circuit on an IC chip includes circuit elements such as transistors, resistors, capacitors, and interconnecting wires, also called traces, lines, or leads, which are generally metal but sometimes can also be formed of other electrically conductive material such as highly doped semiconductor. The circuit is located at one surface or side of the chip, also called the active surface, front side, or top side. Electrical connections to circuits on the chip can be made by wire bonds when the circuit side is accessible, and alternatively, by solder or other suitable conductive material to contact regions brought to the back (bottom) side of the chip, that match with corresponding contact regions and traces on an adjacent chip or the substrate, when the circuit side is not accessible for wire bonding, as in a stack of chips, or when the active surface is used for mounting. Connection of a chip to matching contact regions is sometimes referred to as flip chip technology. It should be noted that the terms "top", "bottom", "under", and "back" are herein used in a relative sense only, to refer to the surfaces of a chip or contact trace, and to chips in a stack, and are not meant to designate particular orientations in space.

Figure 2:
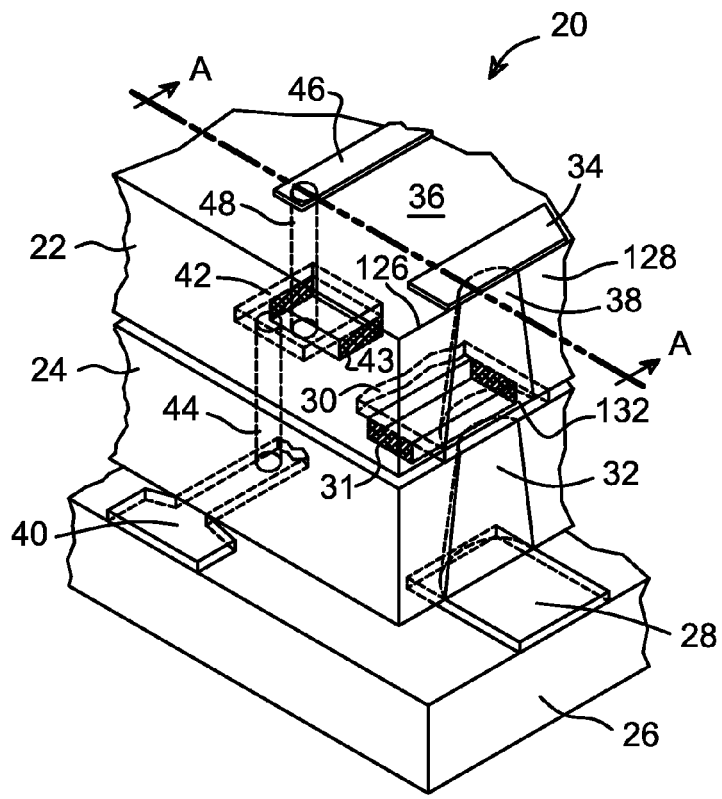
FIG. 2 is a perspective view of a first embodiment of the invention.
Figure 3:
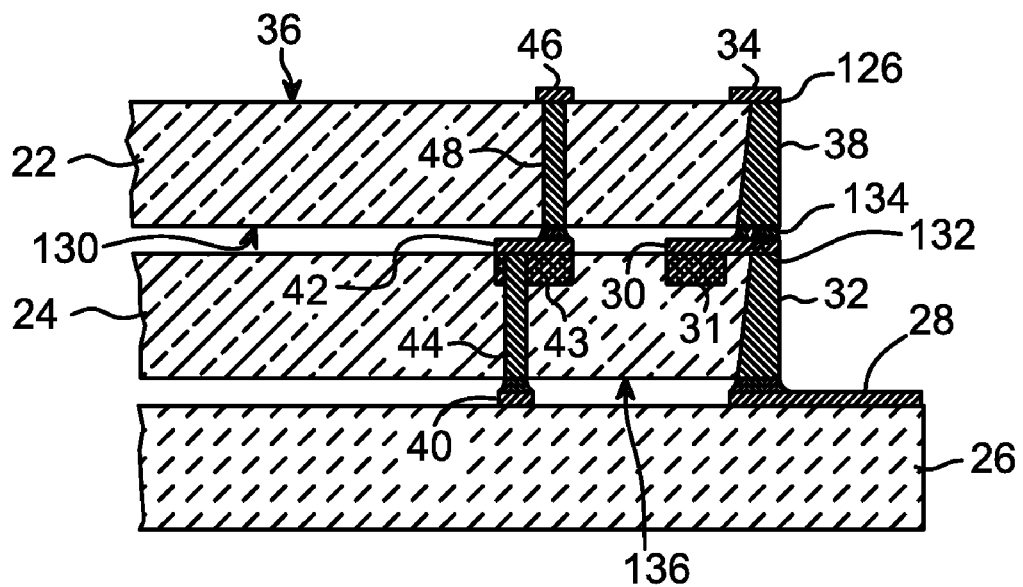
FIG. 3 is a cross-sectional view of the FIG. 2 embodiment.

In the embodiment shown in FIGS. 2, 3, chips 22, 24 are in a "face-up" orientation, that is, the active surface faces away from the electrical connection pads of the substrate, and also away from the active surface of an adjacent chip in the stack. According to the present embodiment of the invention external connection lead 28 on substrate 26 is electrically connected to an input trace 30 of an ESD protection circuit 31 on chip 24 by a first embedded edge wrap connector 32, and further connected to an I/O contact (trace) 34 on the active surface 36 of unprotected chip 22, by a second embedded edge wrap connector 38 also connected to trace 30. Connector 38 can be aligned with the first connector 32 as shown in FIGS. 2, 3, and alternatively it can be not aligned, as long as it is also connected to trace 30. The ESD protection circuit 31 can be, for example, a transient voltage suppressing diode under input trace 30, and it can alternatively include transistor shunting circuits, RC filters, avalanche diodes, and other ESD protection structures known in the art. An edge wrap connector (in short, "edge wrap") is herein understood to be an electrically conductive region of material typically but not necessarily metallic, conforming to, electrically insulated from, and attached to surface portions of a chip, for providing an electrical connection from the active side to the back side of the chip. Embedded edge wrap, such as connectors 32 and 38 shown in the figures, is a new improved edge wrap connector that will be described in greater detail hereinbelow. In an alternate embodiment, another type of edge wrap connector, differing in details of shape and process of formation, can be employed, such as for example, ChipScale™ edge wrap, which is described in Chen, Marcoux, et al., U.S. Pat. No. 5,910,687.

According to an alternate embodiment, also illustrated in FIGS. 2, 3, external connection lead 40 on substrate 26 is electrically connected to an input trace 42 of an ESD protection circuit 43, for example a transient voltage suppressing diode or other suitable protection circuit, on chip 24 by a through-silicon via connector 44 (in short, "TSV"), which is known in the art and described for example in Jan Vardaman, "3-D Through-Silicon Vias become a reality", Semiconductor International, No. 6, Jun. 1, 2007, and further connected to an I/O contact 46 on the active surface of chip 22 by another TSV connector 48. An example of a TSV is a generally cylindrical, or slightly conical, region containing conductive material providing electrical connection extending from the circuit side of a chip to its back side, and connecting to traces on the circuit and to appropriately aligned traces on an adjacent chip or substrate, either by cold formed (pressure formed, extruded) regions of the via metal or by solder bumps at the back. As known in the art, the conductive material in a TSV can be plated metal, which may or may not completely fill a hole through the chip, according to the process and the application. While the current standard location for TSVs is near the chip edges, TSVs can be formed also at optimum locations within the active circuit areas, to make shorter connections from appropriately aligned I/O contacts of circuits on the unprotected IC chips of a stack to ESD-protection circuits on the ESD protection chip.

In the interest of clarity, only portions of traces 30, 34, 42, 46, and symbolic representation of the ESD protection circuits 31, 43 are shown in FIGS. 2 and 3, and other circuit elements, which are arranged in the active surface layer of chips 22, 24, adjacent to and electrically in contact with the respective traces, are not shown. A substrate, that is for example a chip carrier, can have pins, insertion leads, contact metal tabs or protrusions, or solder bumps (not shown in the figures) attached to external connection leads 28, 40. The cross sectional size and shape of the embedded edge wrap and TSV connectors are shown in the figures for illustrative purposes only, and may be different according to the application.

This embodiment of the invention with reference to FIGS. 2 and 3 uses an improved embedded edge wrap 38. Edge wrap 38 is a conductive region in the form of a column of conductive material that is embedded in the edge of chip 22, for providing an electrical connection from the active side to the back side of the chip, with an intervening thin electrically insulating layer of suitable material, for example silicon dioxide or other oxide, attached to, and located between, the chip and the conductive material. In the interest of clarity, the electrically insulating layer, and other electrically insulating layers between a trace and semiconductor surface are not shown in the figures. The embedded edge wrap connector 38 on chip 22 is electrically (and mechanically) connected and attached to a circuit trace 34 located near an edge 126 of the chip on the active surface 36; and as another example, edge wrap connector 32 on chip 24 is connected and attached to circuit trace 30 on the active surface of chip 24. The embedded edge wrap connection 38 then crosses (spans) a sidewall 128 (which is not necessarily flat or a single plane); and the embedded edge wrap 38 is electrically insulated from the sidewall 128 by the intervening insulating layer, as noted hereinabove. The edge wrap 38 further extends to the back (bottom) side 130 of chip 22 where it has a back contact surface 132 that can be attached to and can make electrical contact to trace 30 on the active surface of adjacent chip 24 in the stack. Alternatively, according to the application, the back contact surface 132 of an embedded edge wrap can be attached to and make contact to the top of another embedded edge wrap that is not necessarily connected to a trace, on the active surface of an adjacent chip. The attachment and electrical contact to the adjacent chip can be by solder 134, or alternatively by an intermediate layer, or extruded or plated up portion of the embedded edge wrap material, and can employ heating, or cold (ultrasonic) welding, or other suitable technique and materials. An electrical connection from trace 34 on the active layer 36 of chip 22 can be made by embedded edge wraps 38 and 32 to the bottom 136 of the stack, to a suitably aligned contact pad 28 on chip carrier 26, or to a contact pad on another type of substrate, or circuit board, or active surface of yet another chip. In an alternate embodiment (not shown), with a different appropriate alignment of the chips of a stack, the (back) contact surface of an embedded edge wrap can be attached for electrical contact to the top of a TSV on an adjacent chip.

Figure 4A:
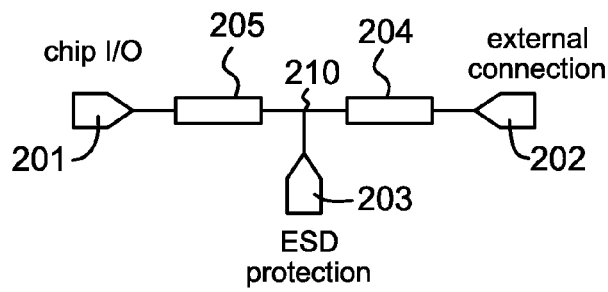
FIG. 4A is an equivalent circuit diagram for ESD protection of an I/O connection.

The basic principles of effective ESD protection of an I/O contact of an IC (chip) in assembly, packaging, and external connection can be understood with reference to FIG. 4A. The figure shows the equivalent circuit diagram of electrical connection between an I/O contact 201, an external connection lead 202, and the input trace of an ESD protection circuit 203, including equivalent impedance 204 of the connector(s) between the external lead 202 and node 210, equivalent impedance 205 of the connector(s) between the chip I/O contact 201 and node 210. Node 210 can be thought of as the branch point of the external connection lead to the contacts 201, 203. It will be apparent to those familiar with the art that for fastest circuit operation it is desirable to have minimum impedance, especially in the form of inductance, between 201 and 202; and for assurance of fast ESD protection it is desirable to have a lower inductance from 210 to 203 than from 210 to 202. These desires are conflicting and require a tradeoff. Thus, the structure according to FIG. 4A, wherein the electrical connection path from the external contact to the ESD protection circuit or device is more direct, is preferable for ESD protection, with care taken to have a low impedance value for 204. It is recognized by the inventor that such low impedance can be achieved by using edge wrap and TSV connectors, as will be described hereinbelow. Further, in the process of packaging and assembly it is desirable to have the connection from 201 to 203 (through branch point 210), and consequently, ESD protection, made first, and as early as possible, to minimize ESD hazard in handling. It is further recognized by the inventor that such a reduction of ESD hazard for IC chips without on-chip ESD protection, can be achieved by an ESD-protected stack, as will be described hereinbelow.

Figure 4B:
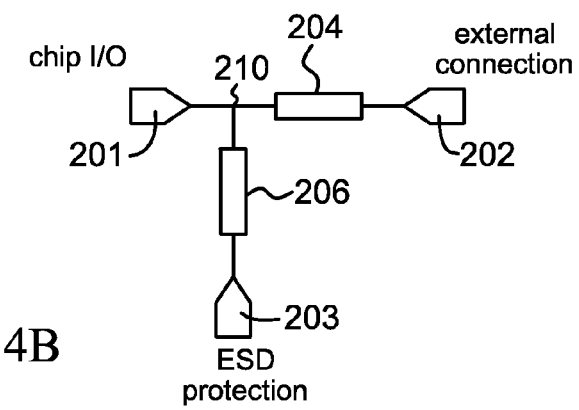
FIG. 4B is a second equivalent circuit diagram for ESD protection of an I/O connection.

FIG. 4B shows a similar but inferior equivalent circuit diagram of electrical connection between an I/O contact 201, an external connection lead 202, and the input trace of an ESD protection circuit 203, including equivalent impedance 204 of the connector(s) between the external lead 202 and node 210, equivalent impedance 205 of the connector(s) between the chip I/O contact 201 and node 210, and equivalent impedance 206 of the connector(s) between the ESD protection circuit and node 210. Node 210 can be thought of as the branch point of the external connection lead to the contacts 201, 203.

According to the invention, the cross-sectional area of the embedded edge wrap and TSVs can be chosen to have an appropriately low inductance and impedance suitable for the operating speed of each particular I/O connection of the unprotected IC and its ESD protection, according to the application. For example, a slower I/O connection can have a smaller-area edge wrap or TSV connectors with accordingly higher impedance (and inductance), than a faster I/O connection having larger-area connectors and accordingly lower impedance (and inductance). In an alternate embodiment, the ESD protection circuit and the I/O contact of an unprotected IC can be connected in parallel to the contact surface for external connection, and in this case, the area of the edge wrap or TSV connector to the ESD protection circuit can be chosen to have suitably low inductance and impedance according to the rise time of ESD protection current required according to the application. It is recognized by the inventor that use of edge wrap and TSV connectors for I/O and ESD protection connections enables customizing of impedance for each connection and consequently can save chip area, especially in high speed applications, wherein some I/Os do not operate at the highest speed but all require ESD protection.

Figure 5:
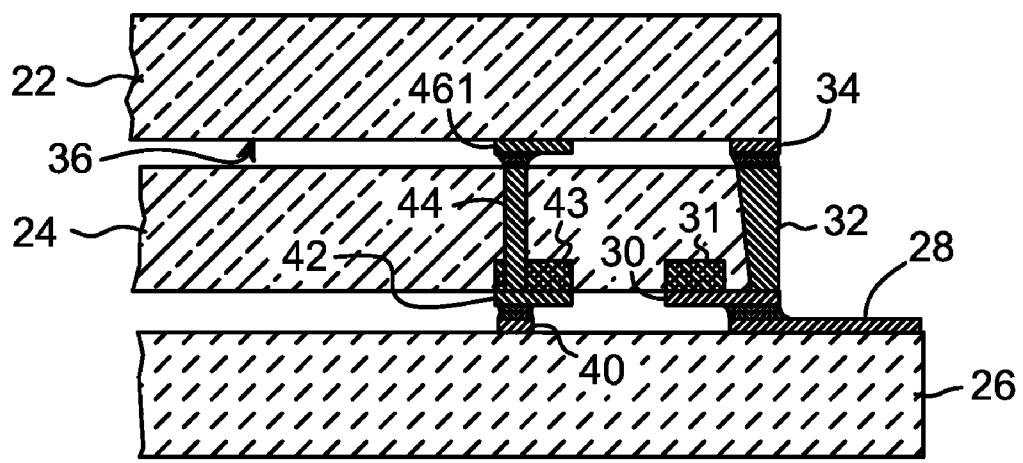
FIG. 5 is a cross-sectional view of a second embodiment of the invention.

In an alternate embodiment, described hereinbelow with reference to FIG. 5, chips 22, 24 can be in a "face-down" orientation. In this alternate (flipped) embodiment, chips 22 and 24 can be stacked to each other and to substrate 26 in a face-down configuration as show in FIG. 5, wherein the active surface of chip 24 faces substrate 26 and the input traces 30, 42 of ESD protection circuits are directly connected to matching contact regions of external connection leads 28, 40 on the substrate, by flip chip technology, and wherein connection to I/O contacts (traces) 34, 461 on the active surface 36 of unprotected chip 22, is made in this case by embedded edge wrap connector 32 and TSV connector 44. It should be noted that in this example the contact trace 461 is a modified form of contact trace 46 shown in FIGS. 2, 3, which matches with the back contact surface of TSV connector 44; further it apparent that TSVs and edge wraps are not needed in chip 22, as no chips are stacked to its back side.

In yet another alternate embodiment, the stack of chips can include a plurality of unprotected IC chips and an ESD protection chip, and in a alternative embodiment, there can be a plurality of ESD protection chips. Electrical connections from stacked chips to external connection leads on the substrate can be passed along intermediate chips by means of embedded edge wraps and/or TSVs, generally as depicted in FIGS. 2-5 and described hereinabove. It is recognized by the inventor that stacking of unprotected IC chips with an ESD protection chip, and electrically connecting the chips by means of embedded edge wraps and/or TSVs, provides a robust ESD protected stack, which is free of the hazard of mechanical damage to wire bonds, and has a reduced hazard of ESD damage to the ICs, in subsequent handling, assembly, and packaging, for system application. In a method of semiconductor device manufacturing according to the invention, one or more unprotected IC chips are stacked, that is, mechanically attached and electrically connected in stack form, as described hereinabove, with one or more ESD protection chips, shortly after singulation of the respective wafers into chips.

Figure 6:
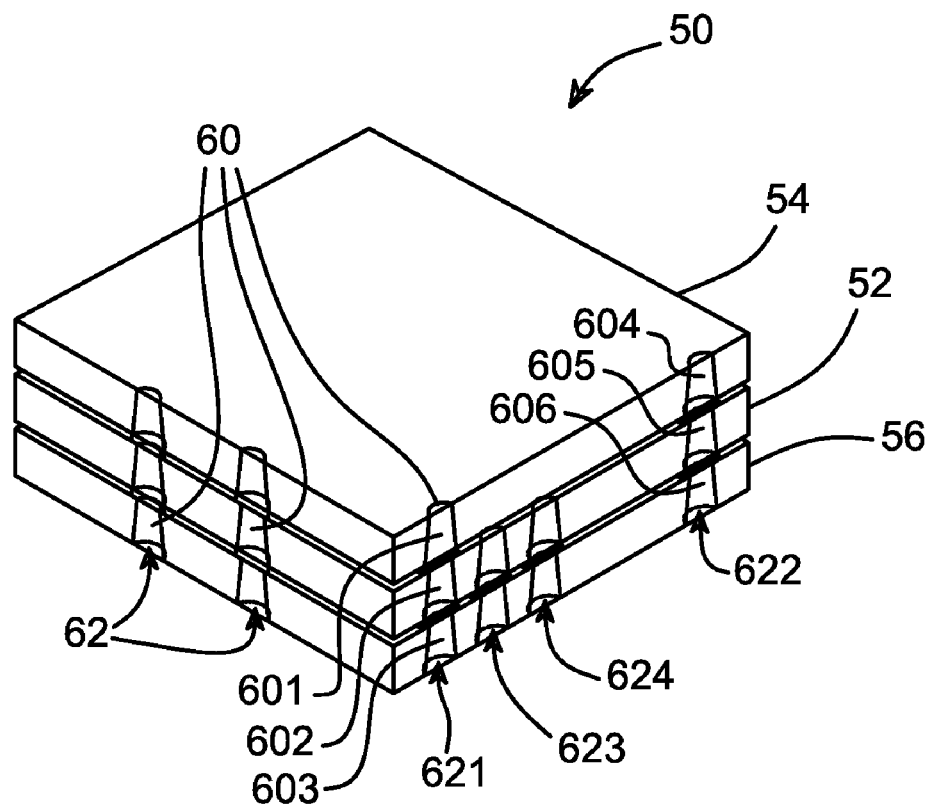
FIG. 6 is a perspective view of a third embodiment of the invention.

An example of an ESD-protected stack 50 according to an embodiment of the invention is shown in FIG. 6, including, in this example, two unprotected IC chips 52, 54 without on-chip ESD protection, and an ESD protection chip 56, and electrical connections for I/O and ESD protection implemented by embedded edge wraps 60. Alternatively, or additionally, the electrical connections can be implemented by TSVs or by a combination of connectors as described hereinabove. In this example, embedded edge wraps 60 have contact surfaces 62 at the bottom of the stack, for external connection by a suitable technique to matching bonding surfaces of leads or traces on a chip carrier, circuit board or other substrate (not shown in FIG. 6). The term "bottom" herein refers to the side of the end chip of the stack that faces the mounting surface of the substrate, and is not meant to denote an absolute orientation in space. Further, according to the invention, a chip of the stack can be in face-up or face-down orientation, with respect to the substrate or an adjacent chip, regardless of the orientation of another chip, according to the application, with disposition and layout of the contact traces, edge wraps, and TSVs coordinated and adapted accordingly. In this example the ESD protection chip 56 is an end chip having a contact surface at the bottom side of the stack. In an alternate embodiment, the end chip can be an unprotected IC chip, and the ESD protection chip can be in another position in the stack, without departing from the teaching of the invention. Suitable techniques of forming the external connection, as known in the art, include use of solder balls and solder bumps, protruding portions of contact metal which can be cold welded, and composite conductive material, such as conductive epoxy. Embedded edge wraps 601, 602, 603 can for example provide an ESD-protected ground (also known as Vss) connection to the circuits on the active surface of both chips 52 and 54, by way of a bottom (back) contact surface 621 on the ESD protection chip 56, which can be connected to a suitably located contact pad of a system ground lead on a substrate, for example by a solder ball, when the stack 50 is mounted for system application. Likewise, embedded edge wraps 604, 605, 606 can provide an ESD-protected power (also known as Vdd) connection, by way of back contact surface 622; and ESD-protected clock external signal and chip select connections can be provided to chip 52 by way of back contact surfaces 623, 624, respectively, as further examples.

Figure 7:
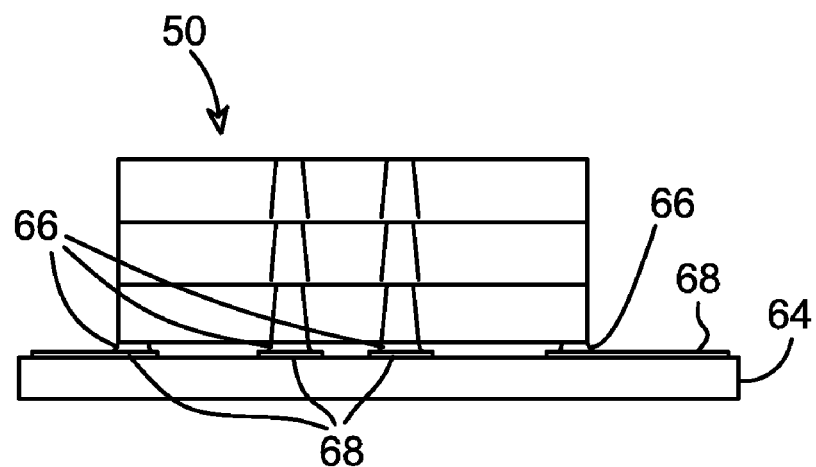
FIG. 7 is a cross-sectional view of the FIG. 6 embodiment.

An ESD-protected stack 50 attached to a chip carrier or substrate 64 is illustrated in FIG. 7, in symbolic profile view, showing solder connections 66 (which can alternatively be cold welded metal, conductive polymer, or other suitable material connections) to external connection leads 68 on the chip carrier or substrate.

There can be many other permutations and combinations of face-up and face-down orientation and relative location of an ESD protection chip and unprotected IC chips in the stack and relative to the substrate and electrical connection by embedded edge wrap, conventional edge wrap, and TSV connectors, wherein the principles of connection described hereinabove can be utilized with equal effect, with only minor modifications.

Figure 8A:
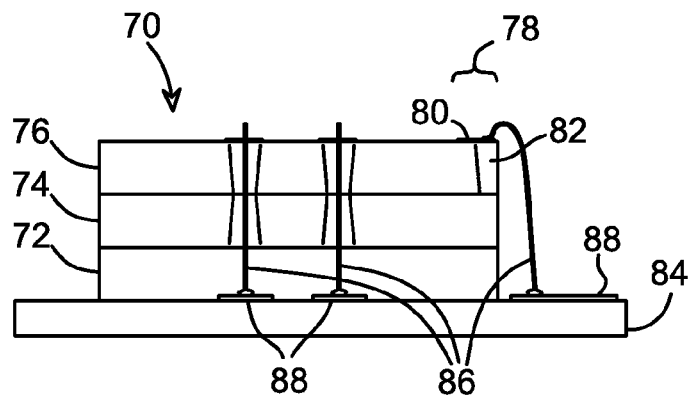
FIG. 8A is a cross-sectional view of a fourth embodiment of the invention.

While it is advantageous in many cases to implement an electrical connection from the stack to the substrate by edge wrap and TSV connectors, as described hereinabove, in some cases it can be desirable to use a wire bond, instead. In a fourth embodiment illustrated in symbolic profile view in FIG. 8A, an ESD-protected stack 70 includes two IC chips 72, 74 without on-chip ESD protection, and an ESD protection chip 76 with an upper surface portion 78 adapted for wire bonding, in this case, located on top of the stack and thereby accessible for wire bonding. A bonding pad 80 adapted for wire bonding is located on the upper surface portion 78 and is electrically connected to an input trace of an ESD protection circuit on the active surface of chip 76. The ESD protection chip 76 can have face-down (flipped) orientation, wherein the upper surface portion 78 is on the back side of the chip, the bonding pad 80 is connected to the back contact surface of an embedded edge wrap connector 82, and electrical connection to the ESD protection circuit extends through the embedded edge wrap connector. For the case of face-up orientation of chip 74, electrical connection to an I/O contact on chip 74 can be implemented for example by a direct flip-chip connection, as described hereinabove. Alternatively, for the case of face-down orientation of chip 74, electrical connection to the I/O contact on chip 74, and also to an I/O contact on chip 72, can extend through edge wrap and/or TSV connectors, according to the application. The stack 70 is depicted in FIG. 8A to be mounted on a substrate 84, and connected by wire bonds 86 from wire bonding pads, such as bonding pad 80, to external connection leads 88 on the substrate, for system application. It should be noted that in this embodiment, IC chip 72 can be oriented face-up, as no contacts are required on its back side, and thus edge wraps and TSVs are not needed on chip 72. This embodiment can be useful in some cases, for including in the stack an unprotected IC chip wherein TSV and edge wrap connectors are undesirable.

Figure 8B:
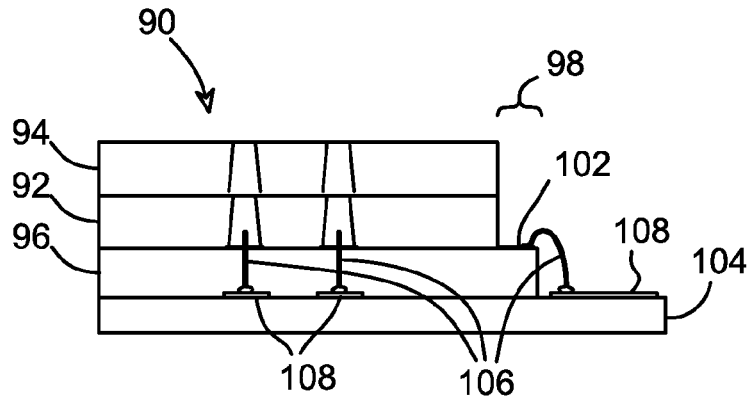
FIG. 8B is a cross-sectional view of a fifth embodiment of the invention.

In the fifth embodiment illustrated in symbolic profile view in FIG. 8B, an upper surface portion 98 adapted for wire bonding can be located, for example, on a portion of a chip that protrudes beyond the rest of the stack and is thereby accessible for wire bonding. As shown in FIG. 8B, an ESD-protected stack 90 includes two IC chips 92, 94 without on-chip ESD protection, and an ESD protection chip 96 having a protruding portion with upper surface portion 98. The ESD protection chip 96 is oriented face-up, and has a bonding pad 102 adapted for wire bonding located on its upper surface portion 98. The bonding pad 102 is electrically connected to an input trace of an ESD protection circuit (not shown) on the active surface of the chip, underlying the stacked IC chips. The protruding portion can include the entire perimeter of chip 96 or a part of it, for example two sides, as shown in FIG. 8B. The stack 90 is depicted in FIG. 8B to be mounted on a substrate 104, and connected by wire bonds 106 from external connection leads 108 on the substrate, to bonding pads on the upper surface portion 98, such as bonding pad 102, for system application. Electrical connection extends from pad 102 to the ESD protection circuit, as noted hereinabove, and still further, can extend through edge wraps or TSVs to an I/O contact on one of unprotected IC chips 92, 94, or on both chips, according to the application. In this embodiment, a wire bond is used instead of an edge wrap or TSV connector, for external connection of the ESD protection chip, and thus edge wraps and TSVs are not needed on that chip. This can be advantageous, for example, for ESD protection chips constructed of a material wherein edge wraps and TSVs are difficult or costly to form.

Figure 8C:
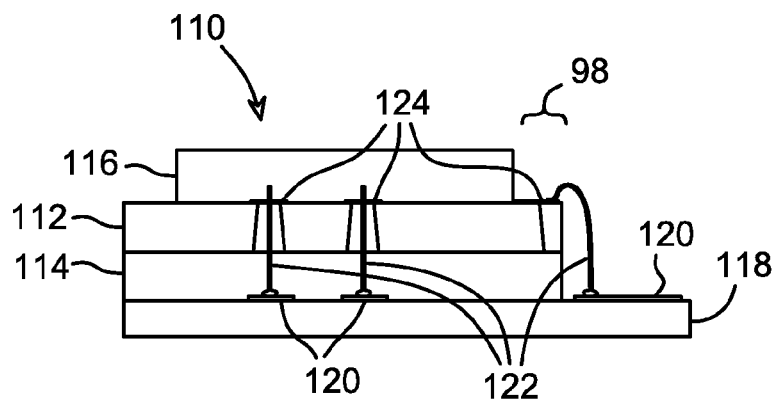
FIG. 8C is a cross-sectional view of a sixth embodiment of the invention.

In the sixth embodiment illustrated in symbolic profile view, in FIG. 8C, the upper surface portion 98 for wire bonding can be on the active surface of an IC chip 112 of a stack 110, instead of on an ESD protection chip 116. In this embodiment, stack 110 includes unprotected IC chips 112, 114, which are oriented face-up, and ESD protection chip 116 that is smaller in size than chip 112 and is oriented face-down, and the stack is mounted on substrate 118 with the back side of chip 114 facing toward, and attached to substrate 118. External connection leads 120 on substrate 118 are connected by wire bonds 122 to bonding pads 124 on the upper surface portion 98, which are electrically connected by traces on the active surface of chip 112, to respective I/O connections thereon, and by flip chip technique, to respective ESD circuits on the active surface of chip 116, and further through embedded edge wraps (and alternatively, by conventional edge wraps, or TSVs) to respective I/O connections of circuits on chip 114. In this embodiment, edge wraps and TSVs are not needed in chips 114 and 116 for purposes of ESD-protection and external I/O connection of IC chips 112, 114 of the stack.

Figure 9:
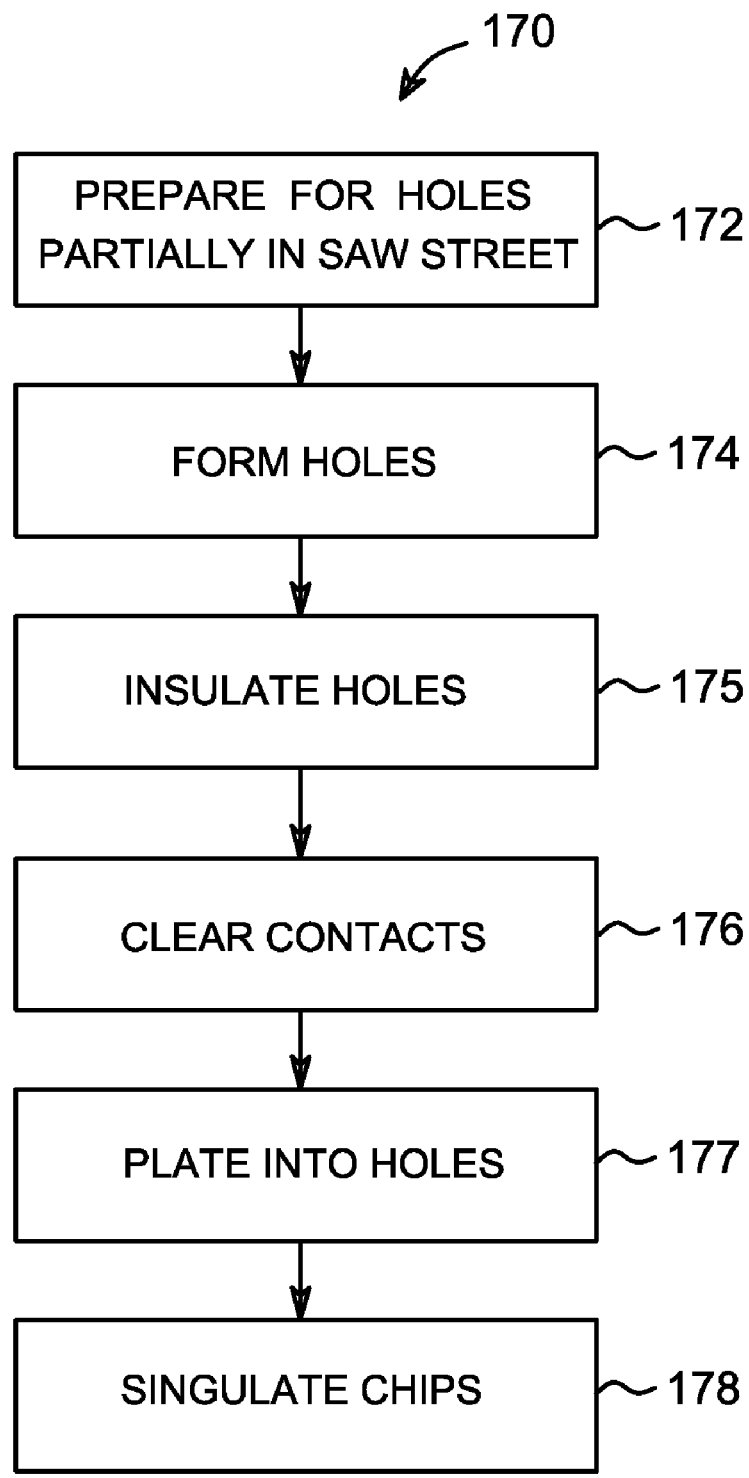
FIG. 9 is a flow diagram of an embodiment of the method of the invention.
Figure 10:
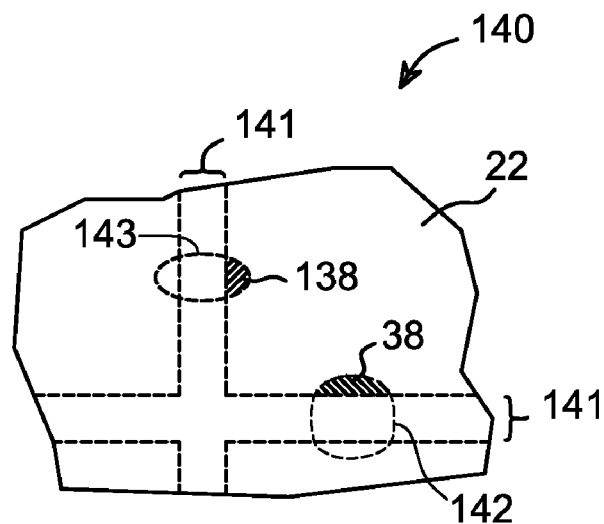
FIG. 10 is a fragmentary plan view of a wafer showing layout of embedded edge wrap connectors and saw streets on the wafer surface from the FIG. 10 method.

A process for forming embedded edge wrap connectors, according to an embodiment of the method of the present invention, is illustrated in FIG. 9, which shows a sequence of steps 170 (also referred to as process or method) in flow diagram form. The input material to the method 170 includes a processed semiconductor wafer containing a plurality of completed circuits in the active surface, which are separated by saw streets, in the conventional manner, and which correspond to a desired plurality of chips. The process can be more clearly understood with reference also to FIG. 10, which shows a plan view of a portion of a wafer 140 including saw streets 141 and corner portions of four chips, including chip 22. Returning to FIG. 9, the first step 172 of the sequence of steps 170, the active side of the wafer is suitably protected and preparation is made on the back side of the wafer for hole formation. In case of etching, this can include the steps of masking, exposing with a pattern of the embedded edge wrap columns, and developing the pattern. In case of laser ablation, it can include the steps of appropriate indexing, and programming of the mechanical stepping, and beam shaping. According to the method of the invention, a plurality of holes are formed in step 174, starting from the back side and extending nearly through the wafer. The holes are suitably arranged straddling the saw street at the edges of the chips, as shown in FIG. 10; for example, the cross section 142 of a hole that will form embedded edge wrap connector 38 is partly located in the saw street 141, and partly located in chip 22, outside the saw street (as indicated by shading in FIG. 10), and likewise, the cross section 143 of a hole that will form another edge wrap connector 138 is partly located in the saw street and partly in chip 22 outside the saw street (indicated by shading). The hole is suitably aligned to abut a contact trace on the active surface as illustrated in FIG. 2, for example trace 34 on active surface 36 of chip 22, for embedded edge wrap 38. The hole formation process can be selective to stop or slow down when the underside of the contact metal layer of the trace is exposed, at the active surface of the wafer; in case of etching, for example, chemical selectivity can be made use of, and in case of laser ablation, differential optical reflectivity can be utilized. Returning to FIG. 9, in step 175, an insulating layer is formed on the sidewalls inside the holes to avoid unintended electrical contact to elements of the active layer and substrate, by a suitable technique, for example thermal oxidation or sputtering of an oxide or other insulating material, that can be used also in forming TSVs. In step 176, contacts for electroplating are cleared by removing any insulating material from the underside of the contact traces in the holes, at the active surface. In step 177, a starting (seed) layer for electroplating is first applied, for example by sputtering metal on the insulating layer on the sidewalls, and then metal columns are plated into the holes. The metal column extends from a contact trace at the active surface to the back side of the wafer, and it may be partly hollow, substantially filled, or overfilled, according to the application and the plating process. In step 178, the wafers are singulated into chips, by removing the material in the saw streets 141, for example by mechanically sawing through the wafer along the saw streets, or alternatively by another suitable process such as water jet, laser ablation, or chemical-mechanical sawing.

The portion of a conductive column that lies in the chip and outside the saw street, shown shaded in FIG. 10, becomes an embedded edge wrap connector, as depicted in FIGS. 2, 3, while the portion that is inside the saw street is removed in step 178, thereby exposing the conductive material of the column at the edge of a chip. It should be noted that the embedded edge wrap connectors are shown to be slightly conical in shape, to account for the characteristic shape produced by a hole formation process. In particular, the resulting conductors are a section of substantially frustoconical shape said section being on a plane parallel to the axis of the cone truncated to form the frustoconical shape. The cross-sectional size and shape of a hole can be tailored individually for the electrical impedance and current-conducting capability of the resulting embedded edge wrap connector, according to the circuit application. In an alternate embodiment the hole and the embedded edge wrap connector can be formed in another suitable shape, with equal effect, according to the application; for example the hole can be substantially cylindrical, or alternatively, it can be wider along the edge of the chip than the distance it extends into the chip.

Figure 12:
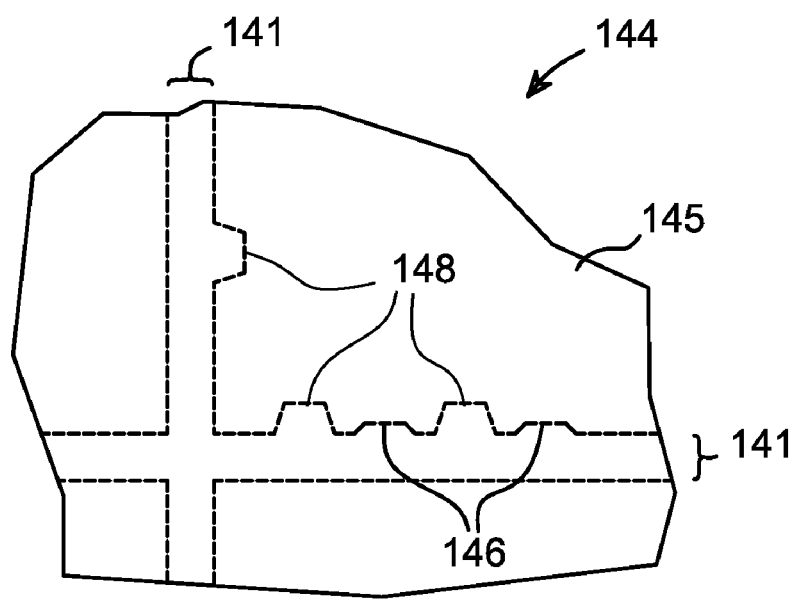
FIG. 12 is a fragmentary plan view of a wafer showing layout of embedded edge wrap connectors and saw streets on the wafer surface from the method of FIG. 11.
Figure 11:
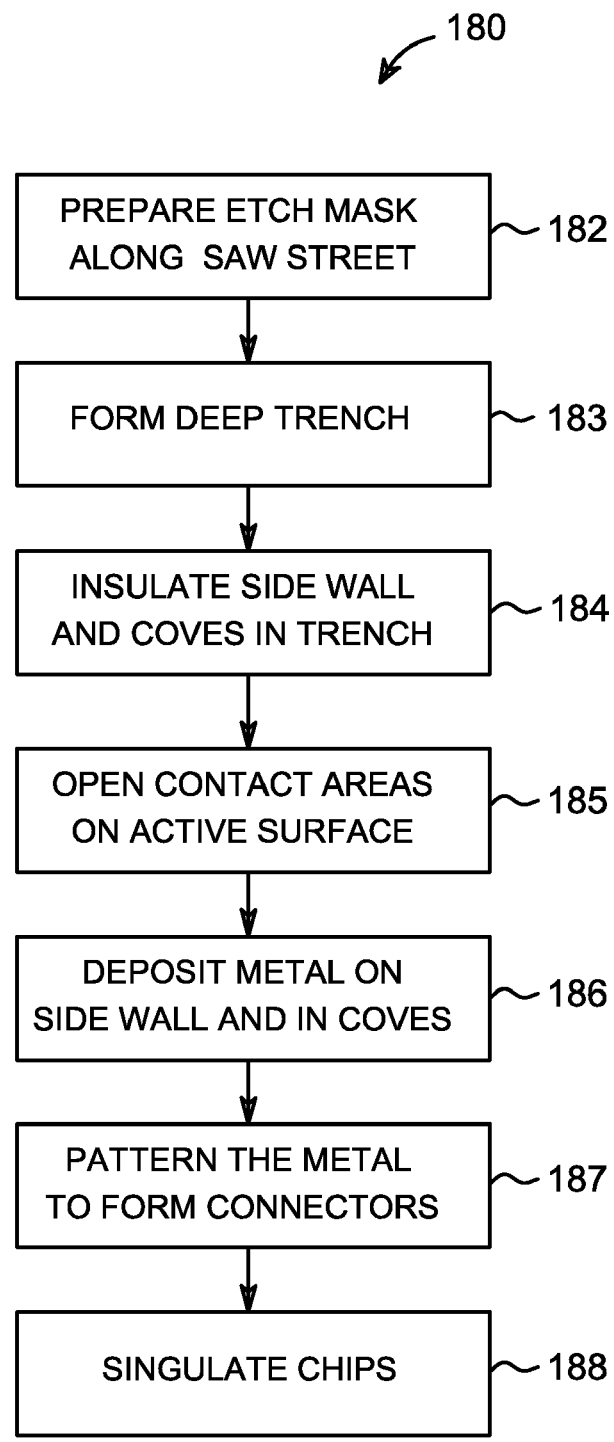
FIG. 11 is a flow diagram of an alternate embodiment of the method of the invention.
Figure 13:
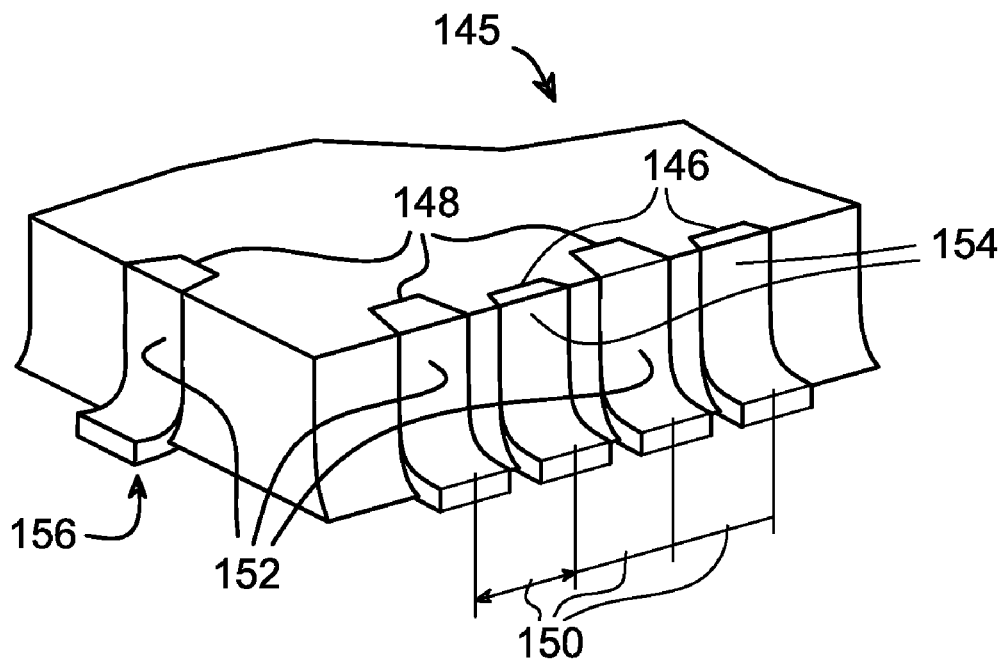
FIG. 13 is a perspective view of embedded edge wrap connectors formed according to the alternate method of FIGS. 11, 12.

An alternate embodiment of the process for forming an embedded edge wrap connector is illustrated in FIGS. 11-13, plating onto a recessed portion (cove) of the sidewall of a trench along the saw street is employed to form the connector, instead of plating into a hole that spans the saw street. In a first step 182 of a sequence of steps 180 of the alternate process, shown in flow diagram form in FIG. 11, an etch mask is prepared on the active surface (top) of a wafer 144 depicted in FIG. 12, showing corner portions of four chips including a chip 145. A mask layer is applied and patterned to expose an area to be etched along saw streets 141. The pattern is adapted to expose recessed (cove) portions 146, 148 of the mask edge along the saw street, the utility of which will be presently described hereinbelow. Returning to FIG. 11, in the next step 183 a deep trench is formed in the exposed area, extending, for example 100 to 150 micrometers, down from the active surface into the wafer, but not completely through the wafer, with its sidewalls conforming to the mask pattern and forming the sidewalls of chips, including chip 145 as shown in FIG. 12. A sidewall accordingly includes both shallow cove portions (areas) 146 and deep cove portions (areas) 148. Returning to FIG. 11, in step 184, an insulating layer is formed on the sidewalls of the trench including coves, to prevent unintended electrical contact to the active layer and substrate, by a suitable technique known in the art, for example thermal oxidation or sputtering of an insulating material. The wafer 144 has traces (not shown in FIGS. 12, 13) on its active surface, adjacent to the edge of a wafer, which are suitably aligned for electrical contact to the edge wrap connectors that will be formed on the sidewall of the trench (and chip) and overlapping with contact area portions of the traces. In step 185, contact areas for electroplating are opened (cleared of insulating material and etch mask material) on the traces, at the edge of the trench. In step 186, a starting (seed) layer is first applied by a known technique, for example sputtering of metal, and then a thicker metal layer is electroplated on the contact areas on the active surface, on the sidewall and in the coves, and on the bottom of the trench. The surface shape of a cove can be adapted to enhance the plating thickness in the deep cove, compared to the thickness of plated metal in the shallow cove portions of the sidewall, for example by superfilling as known in the art. In step 187, the conductive material is selectively removed from the active surface, the sidewall, and the bottom of the trench so as to electrically isolate a plurality of conductive strips on the sidewall of the chip, as shown in FIG. 13, which can have a uniform spacing (pad pitch) 150 along the edge. The strips in the deep cove portions 148 of the sidewall comprise embedded edge wrap connectors 152 that have a larger cross-sectional area, and the strips 154 on the shallow portions 146 comprise embedded edge wrap connectors 154 that have a smaller cross sectional area. The current-carrying capacity and impedance of an edge wrap connector depends on the cross-sectional area and can thus be tailored for the application, while keeping a uniform pad pitch 150 on the chip, which is generally desirable for assembly. By selectively leaving extensions 156 of the conductive strips also on the bottom of the trench, the edge wrap connectors can extend distally from the sidewalls of the chip, as shown in FIG. 13, for more convenient packaging. Returning to FIG. 11, in the last step 188, the wafer is singulated into chips (dice) by thinning from the back side of the wafer up to the bottom of the trench, and exposing the underside of the conductive strips, for attachment and connection to an adjacent chip or substrate.

Figure 14:
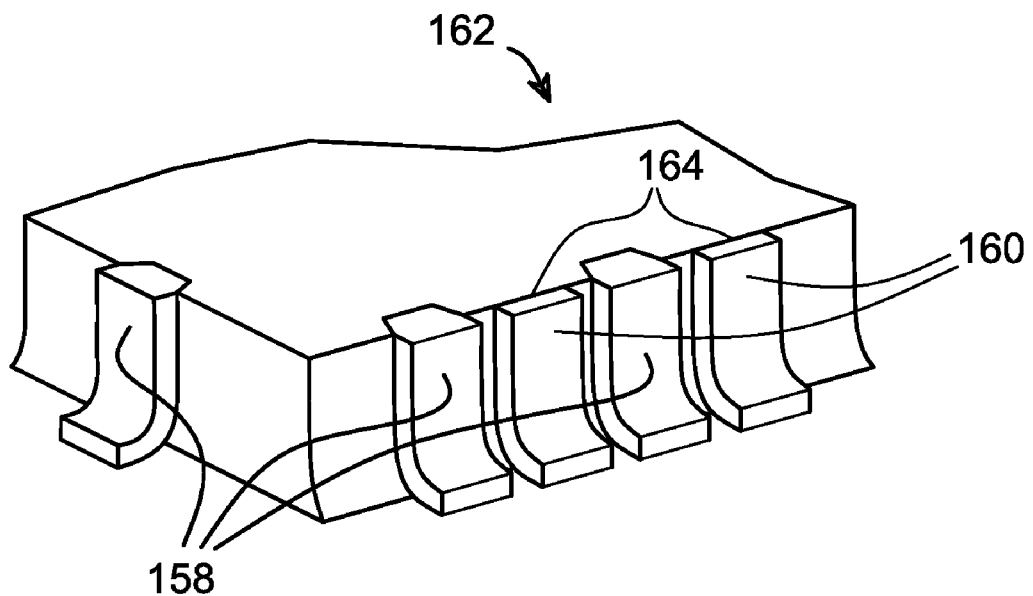
FIG. 14 is a symbolic perspective view of embedded edge wrap connectors and conventional edge wrap connectors on a chip, formed according to the alternate method.

FIG. 14 illustrates the result of another alternative embodiment of the process of FIG. 11. The etch mask pattern in step 182 and the forming of connectors by selective removal of conductive material in step 187 described hereinabove, can be adapted to form embedded edge wrap connectors. FIG. 14 shows such embedded edge wrap connectors 158 and conventional edge wrap strips 160 (such as a ChipScale™ edge wrap) on the same chip 162. The etch pattern in this case has straight portions 164 in place of the shallow recessed portions 146 shown in FIGS. 12, 13, and the embedded edge wrap connectors 158 can be partially protruding from the sidewall, as show in the figure.

In a yet another alternate method according to the invention, before a semiconductor wafer holding a plurality of unprotected IC chips, and a wafer holding a plurality of chips having ESD protection circuits, are singulated into chips, the wafers can be suitably aligned and stacked, as described hereinabove. Then the wafers can be singulated into stacked chips, by removing the material from the saw streets, which are adapted to be in alignment on the plurality of wafers of a stack. Alternatively, portions of wafers, instead of entire wafers, can be aligned, stacked, and singulated into stacked chips, as described hereinabove.

Although the invention has been described with reference to specific exemplary embodiments, it will be evident that various modifications and changes may be made without departing from the broader spirit and scope of the invention as set forth in the appended claims. The specification and drawings are, accordingly, to be regarded in an illustrative rather than a restrictive sense.

INDUSTRIAL APPLICABILITY

The inventive ESD devices 24, edge wrap connectors 32, TSV connectors 44, stacks 50, contact surfaces 62 and methods for fabricating the devices are intended to be widely used in a great variety of electronic and communication applications. It is expected that they will be particularly useful in applications where significant resistance to electrostatic discharge is required. As discussed previously herein, the applicability of the present invention is such that the inputting information and instructions are greatly enhanced, both in speed and versatility. The inventive ESD devices 24, edge wrap connectors 32, TSV connectors 44, stacks 50, contact surfaces 62 and methods for fabricating the devices may be readily produced and integrated with existing tasks, devices and the like, and since the advantages as described herein are provided, it is expected that they will be readily accepted in the industry. For these and other reasons, it is expected that the utility and industrial applicability of the invention will be both significant in scope and long-lasting in duration.

REFERENCE CHARACTER LIST

NOTICE: This reference character list is provided for informational purposes only, and it is not a part of the official patent application.

- 10 wire bonds
- 11 external connection lead
- 12 chip carrier, substrate
- 13 ESD protection device
- 14 intermediate substrate
- 15 ESD protection chip
- 16 I/O contact
- 17 IC chip that has no on-chip ESD protection
- 20 device including a stack of chips and a substrate
- 22 unprotected IC chip (that has no on-chip ESD protection)
- 24 ESD protection chip
- 26 substrate (chip carrier, circuit board)
- 28, 40 external connection lead on substrate
- 30, 42 input trace of ESD protection circuit
- 31, 43 ESD protection circuit
- 32, 38 embedded edge wrap connector
- 34, 46, 461 I/O contact (trace)
- 36 active surface
- 44, 48 TSV connector
- 50 ESD protected stack of chips
- 52, 54, 72, 74, 92, 94, 112, 114 unprotected IC chip (that has no on-chip ESD protection)
- 56, 76, 96, 116 ESD protection chip
- 60, 82, 601-606 embedded edge wrap connector
- 62, 621-624 contact surface
- 64, 84, 104, 118 substrate (chip carrier, circuit board)
- 66 solder connection (cold welded metal, conductive polymer)
- 68, 88, 108, 120 external connection lead
- 78, 98 upper contact surface
- 80, 102, 124 wire bonding pad
- 86, 106, 122 wire bond
- 126 edge of chip
- 128 sidewall
- 130 back (bottom) side of chip
- 132 back contact surface
- 134 solder
- 136 bottom of stack
- 138 embedded edge wrap connector
- 140, 144 wafer (portion of)
- 141 saw street
- 142, 143 cross section of hole
- 145 chip
- 146 shallow recessed (cove) portion
- 148 deep recessed (cove) portion
- 150 spacing (pad pitch)
- 152, 154, 158 embedded edge wrap connector
- 156 extension
- 160 conventional edge wrap connector
- 170, 180 sequence of steps (process, method)
- 172-178, 182-188 step (of the process)
- 201 I/O contact 202 external connection lead
203 input trace of ESD protection circuit
204, 205, 206 equivalent impedance of connector(s)
210 node (branch point)

The invention claimed is:

1. A semiconductor stack assembly having ESD protection comprising, a first chip including an integrated circuit (IC) with an input/output (I/O) trace without on-chip electrostatic discharge (ESD) protection; and
a second chip having an ESD protection circuit, said first chip being electrically connected to said second chip with a conductor to said ESD protection circuit and said I/O trace wherein said conductor is formed during manufacture of said chips; and
a substrate, on the second chip, including an external connection lead, wherein said second chip includes a contact surface comprising a back contact surface, disposed facing and matching a contact area of the external connection lead and electrically connected thereto by conductive material.

2. A semiconductor stack assembly having ESD protection as in claim 1, wherein said conductor is selected from the group of connectors consisting of embedded edge wrap connector, edge wrap connector, and through-silicon via (TSV) connector.

3. A semiconductor stack assembly having ESD protection as in claim 1, wherein no wire bonds are present.

4. A semiconductor stack assembly having ESD protection as in claim 1, wherein the conductive material is one of the group of materials consisting of solder, metal, conductive polymer, conductive epoxy.

5. A semiconductor stack assembly having ESD protection as in claim 2, wherein at least one of the first and second chips an upper surface portion adapted for wire bonding, and wherein a contact surface for external connection comprises a wire bonding pad disposed on the upper surface portion.

6. A semiconductor stack assembly having ESD protection as in claim 5, wherein the upper surface portion is on a chip protruding from the stack.

7. A semiconductor stack assembly having ESD protection comprising, a first chip including an integrated circuit (IC) with an input/output (I/O) trace without on-chip electrostatic discharge (ESD) protection; and
a second chip having an ESD protection circuit, said first chip being electrically connected to said second chip with a conductor to said ESD protection circuit and said I/O trace wherein said conductor is formed during manufacture of said chips, wherein said conductor comprises an embedded edge wrap conductor substantially having a shape of a section of a cylinder.

8. A semiconductor stack assembly having ESD protection as in claim 7, further comprising an enlarged area for attachment to an external attachment lead on a substrate.

9. A semiconductor stack assembly having ESD protection as in claim 7, further comprising an enlarged area for attachment to an external attachment on a semiconductor chip.

10. A semiconductor stack assembly having ESD protection comprising, a first chip including an integrated circuit (IC) with an input/output (I/O) trace without on-chip electrostatic discharge (ESD) protection; and
a second chip having an ESD protection circuit, said first chip being electrically connected to said second chip with a conductor to said ESD protection circuit and said I/O trace wherein said conductor is formed during manufacture of said chips, wherein said conductor comprises an embedded edge wrap conductor substantially having a shape of a section of a frustoconical cone said section being on a plane parallel to the axis of the frustoconical cone.

11. A method for making an embedded edge wrap conductor from a blank of material for use for production of multiple IC chips upon separation comprising:
masking a masked area of the chip to create cove portions adjacent the area where the chips will be separated;
trenching the masked area to form a trench having sidewalls with coves in the masked areas;
insulating said sidewalls and coves in said trench;
removing insulation to open contact on said coves where contact is desired;
depositing conducting material in said trench and coves; and,
singulating the chips along said trench.

12. A method for making an embedded edge wrap conductor from a blank of material for use for production of multiple IC chips upon separation as in claim 11, further comprising:
patterning the deposited conducting material to form conductors.

13. A method for making an embedded edge wrap conductor from a blank of material for use for production of multiple IC chips upon separation as in claim 12, wherein said patterning is adapted to form the conductors to protrude from the sidewall.

* * * * *